US009640740B2

(12) United States Patent
Wang

(10) Patent No.: US 9,640,740 B2
(45) Date of Patent: May 2, 2017

(54) LED LIGHTING DEVICE AND PACKAGING METHOD

(71) Applicants: BOE TECHNOLOGY GROUP CO., LTD., Beijing (CN); BOE OPTICAL SCIENCE AND TECHNOLOGY CO., LTD., Suzhou (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 14/498,260

(22) Filed: Sep. 26, 2014

(65) Prior Publication Data

US 2015/0364662 A1 Dec. 17, 2015

(30) Foreign Application Priority Data

Jun. 17, 2014 (CN) .......................... 2014 1 0270551

(51) Int. Cl.
*H01L 33/58* (2010.01)
*H01L 33/50* (2010.01)

(52) U.S. Cl.
CPC ............ *H01L 33/58* (2013.01); *H01L 33/501* (2013.01); *H01L 2933/0041* (2013.01); *H01L 2933/0058* (2013.01)

(58) Field of Classification Search
CPC ....................................................... H01L 33/58
See application file for complete search history.

(56) References Cited

U.S. PATENT DOCUMENTS

| | | | | |
|---|---|---|---|---|
| 6,576,930 | B2 * | 6/2003 | Reeh et al. | 257/98 |
| 7,731,395 | B2 * | 6/2010 | Parkyn et al. | 362/335 |
| 7,906,793 | B2 * | 3/2011 | Negley | 257/98 |
| 8,154,043 | B2 * | 4/2012 | Andrews et al. | 257/98 |
| 2004/0170018 | A1 * | 9/2004 | Nawashiro | 362/244 |
| 2011/0235306 | A1 * | 9/2011 | Li et al. | 362/84 |
| 2012/0037944 | A1 * | 2/2012 | Takine | H01L 33/58 257/98 |

FOREIGN PATENT DOCUMENTS

CN 203325969 U 12/2013

OTHER PUBLICATIONS

1st office action issued in corresponding Chinese application No. 201410270551.X dated Jul. 19, 2016.

* cited by examiner

*Primary Examiner* — Lex Malsawma
(74) *Attorney, Agent, or Firm* — Nath, Goldberg & Meyer; Joshua B. Goldberg; Leonid D. Thenor

(57) ABSTRACT

The disclosure relates to a LED lighting device and a packaging method. The LED lighting device comprises a frame and at least one chip fixed in the frame, and further comprises a light emitting layer and a light condensing layer, wherein the light emitting layer wraps the chip, and the light condensing layer is arranged on the light emitting layer and configured for converging light passing through the light emitting layer.

4 Claims, 3 Drawing Sheets

2
3
1
4
5

LED LIGHTING DEVICE AND PACKAGING METHOD

FIELD OF THE INVENTION

The disclosure relates to the field of display technology, and particularly relates to a LED lighting device and a packaging method.

BACKGROUND OF THE INVENTION

Light emitting diode (LED) technology has been vigorously developed in recent years. LEDs have the advantages of energy conservation, high efficiency, quick response, long lifespan, environmental friendliness and the like, and thus have already been widely applied in people's life. With respect to the LED technology, improving LED brightness is one of directions that people always dedicate to research.

A structure of a LED of the prior art is shown in FIG. 1, and generally comprises a frame, a colloid (phosphor powder and packaging adhesive), connection wires and chips. The chips are connected to the frame by the connection wires, and the colloid is located in the frame as a light emitting layer. In the prior art, there are methods for improving the LED brightness as follows: one method is improving the LED brightness by increasing the number of the chips, however, this method may increase the manufacturing cost of the LED, and moreover, the heat dissipation is a problem difficult to solve due to the increase of the number of the chips; another method is improving the light emitting efficiency by improving the chips or improving the luminous brightness by finding out a novel phosphor powder formula, however, these two methods are long in research and development periods, high in costs, and difficult to realize rapidly; still another method is improving the LED brightness by adjusting a control circuit, however, the heat dissipation problem of the control circuit is difficult to solve; and another method is improving the LED brightness by controlling the angle of the side surface of the frame, however, this method has a defect that a light emitting angle can only be locally adjusted, and thus plays a minor role in improving brightness.

Therefore, in view of the above problems in the prior art, a LED lighting device, which can effectively improve brightness, and has low manufacturing cost and simple structure, and a packaging method thereof are required.

SUMMARY OF THE INVENTION

The disclosure provides a LED lighting device and a packaging method thereof, which can effectively improve LED brightness and reduce manufacturing cost, and the following advantages can be achieved: the LED lighting device has a simple structure, the packaging method has strong practicability, and the like.

According to an aspect of the disclosure, a LED lighting device is provided, which comprises a frame and at least one chip fixed in the frame. The LED lighting device further comprises a light emitting layer and a light condensing layer, the light emitting layer wraps the chip, and the light condensing layer is arranged on the light emitting layer and configured for converging light passing through the light emitting layer.

According to an embodiment of the disclosure, the light condensing layer may have a shape of a convex lens.

According to an embodiment of the disclosure, an upper surface of the light condensing layer may be a convexity, and a lower surface of the light condensing layer and an upper surface of the light emitting layer may be planes.

According to an embodiment of the disclosure, an upper surface and a lower surface of the light condensing layer may be convexities, and an upper surface of the light emitting layer may be a concave corresponding to the lower surface of the light condensing layer.

According to an embodiment of the disclosure, the convexity may be a curved surface, and a curvature radius of the curved surface is greater than or equal to ½ of a length of the LED lighting device, and less than or equal to 10 times of the length of the LED lighting device.

According to an embodiment of the disclosure, the light condensing layer may be formed by a packaging adhesive, and the light emitting layer may be prepared by mixing phosphor powder with the packaging adhesive.

According to an embodiment of the disclosure, the at least one chip may be fixed to a bottom of the frame by a die bond adhesive.

According to another aspect of the disclosure, a packaging method of a LED lighting device is provided, and the packaging method comprises steps of: fixing chips to a bottom of a frame; connecting electrodes of the chips to the frame; injecting molten-state mixed colloid of phosphor powder and packaging adhesive into the frame to form a light emitting layer; and injecting molten-state packaging adhesive into the frame to form a light condensing layer.

According to an embodiment of the disclosure, the step of forming the light emitting layer may comprise: pressing the molten-state mixed colloid of the phosphor powder and the packaging adhesive by an outward-bulged mould to form the light emitting layer with a concave upper surface.

According to an embodiment of the disclosure, the step of forming the light condensing layer may comprise: pressing the molten-state packaging adhesive by an inward-recessed mould to form the light condensing layer with a convex upper surface.

In the LED lighting device according to the disclosure, the light emitting layer wraps the chips, and the light condensing layer is arranged on the light emitting layer, thus light passing through the light emitting layer are converged by the light condensing layer. The brightness of the LED lighting device is improved by virtue of the light converging principle of a convex lens. In the packaging method according to the disclosure, two injections are carried out to form the light emitting layer and the light condensing layer, respectively, thus realizing the LED lighting device according to the disclosure.

REFERENCE NUMERALS

Figure 1:
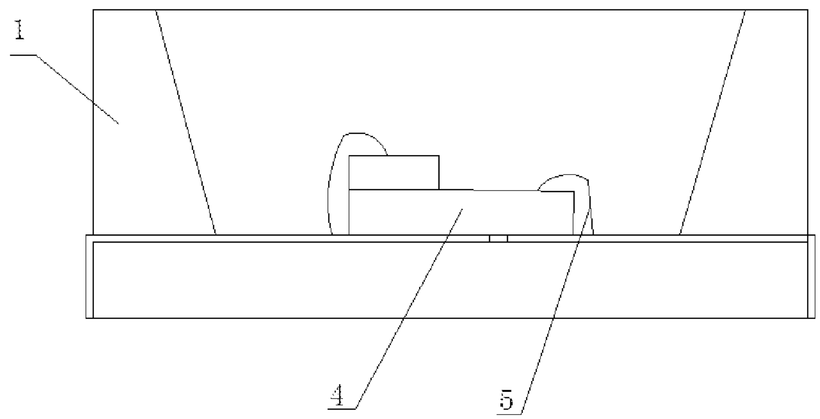
FIG. 1 is a schematic diagram of a structure of a LED lighting device of the prior art.

1. frame; 2. light condensing layer; 3. light emitting layer; 4. chip; 5. connection wire.

DETAILED DESCRIPTION OF THE EMBODIMENTS

The implementations of the disclosure are further described below in detail in conjunction with the accompanying drawings and the embodiments. The following embodiments are used for illustrating the disclosure, rather than limiting the scope of the disclosure.

In the description of the disclosure, unless otherwise noted, the term 'a plurality of' indicates two or more; the orientations or position relationships indicated by the terms 'up', 'down', 'left', 'right', 'inside', 'outside', 'front end', 'rear end', 'head', 'tail' and the like are based on the orientations or position relationships shown in the drawings, and these terms are only for convenience of describing the disclosure and simplifying the description, instead of indicating or implying that the device or component must be in a specific orientation, and configured and operated at a specific orientation, and therefore cannot be interpreted as limits on the disclosure.

In the description of the disclosure, unless otherwise noted and defined, the terms 'installing', 'interconnecting' and 'connecting' should be broadly understood, for example, 'connecting' may be fixedly connecting or detachably connecting or integrally connecting; may be mechanically connecting or electrically connecting; may also be directly connecting or indirectly connecting via an intervening medium. Those skilled in the art can understand the specific meanings of the above terms in the disclosure based on specific conditions.

Figure 2:
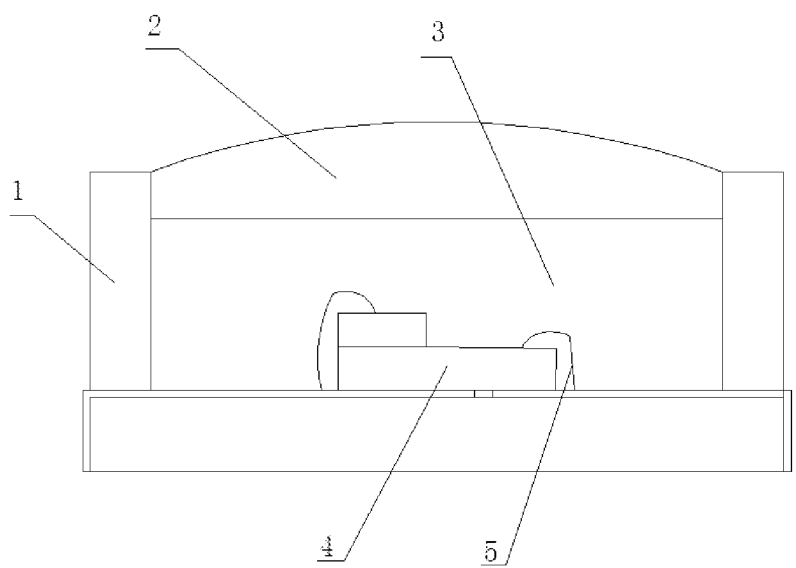
FIG. 2 is a schematic diagram of a structure of a LED lighting device according to an embodiment of the disclosure.

FIG. 2 is a schematic diagram of a structure of a LED lighting device according to an embodiment of the disclosure.

As shown in FIG. 2, the LED lighting device according to the embodiment comprises a frame 1 and at least one chip 4 fixed in the frame 1. The LED lighting device further comprises a light emitting layer 3 and a light condensing layer 2, the light emitting layer 3 wraps the chip 4, and the light condensing layer 2 is arranged on the light emitting layer 3 and configured for converging light passing through the light emitting layer 3.

The LED lighting device can improve brightness by using the light condensing layer 2 having a shape of a convex lens, and the light condensing layer 2 is in the shape of a convex lens with a thick centre and a thin edge. When the light passing through the light emitting layer 3 enters the light condensing layer 2, the light can be converged after being refracted twice on the lower surface and the upper surface of the light condensing layer 2, so as to realize a purpose of light converging, thus improving the brightness.

Compared with methods for improving the LED brightness in the prior art, the LED lighting device does not require high research and development cost, the chip 4 may be connected to the frame 1 by connection wires 5 and be fixed to the bottom of the frame 1 by a die bond adhesive, and the light condensing layer 2 having the shape of a convex lens is capable of converging light, thus the LED brightness is effectively improved without increasing manufacturing cost, and moreover, the LED lighting device has high practicability.

According to the embodiment shown in FIG. 2, the upper surface of the light condensing layer 2 is a convexity, and the lower surface of the light condensing layer 2 and the upper surface of the light emitting layer 3 are planes.

Figure 3:
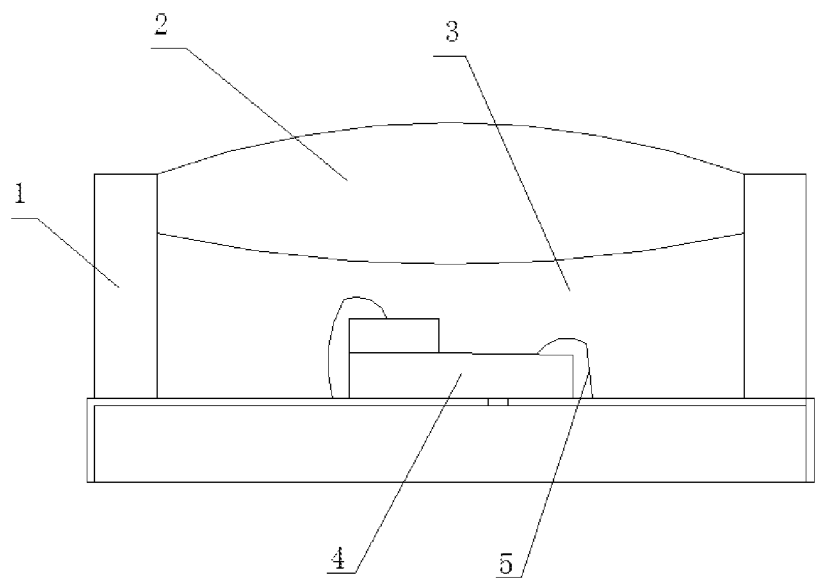
FIGS. 3 and 4 are schematic diagrams of structures of LED lighting devices according to other embodiments of the disclosure.

Also, the upper surface and the lower surface of the light condensing layer 2 may be set as convexities, and the upper surface of the light emitting layer 3 may be set as a concave corresponding to the lower surface of the light condensing layer 2, as shown in FIG. 3. This structure achieves the effect of converging light as well.

According to the respective embodiments of the disclosure, the convexity may be a curved surface, and the curvature radius of the curved surface is greater than or equal to ½ of the length of the LED lighting device, and less than or equal to 10 times of the length of the LED lighting device. When the curvature radius of the curved surface of the convexity is in this range, the light can be converged obviously.

According to the respective embodiments of the disclosure, the light condensing layer 2 may be formed by transparent packaging adhesive, and the light emitting layer 3 may be prepared by mixing phosphor powder with the packaging adhesive. The packaging adhesive may be transparent epoxy resin or other hot-melt-state substance with high light transmittance. The light emitted from the light emitting layer 3 are refracted on the light condensing layer 2 to realize a converging function, thus narrowing light emitting range, so that light intensity distribution is more concentrated.

Figure 4:
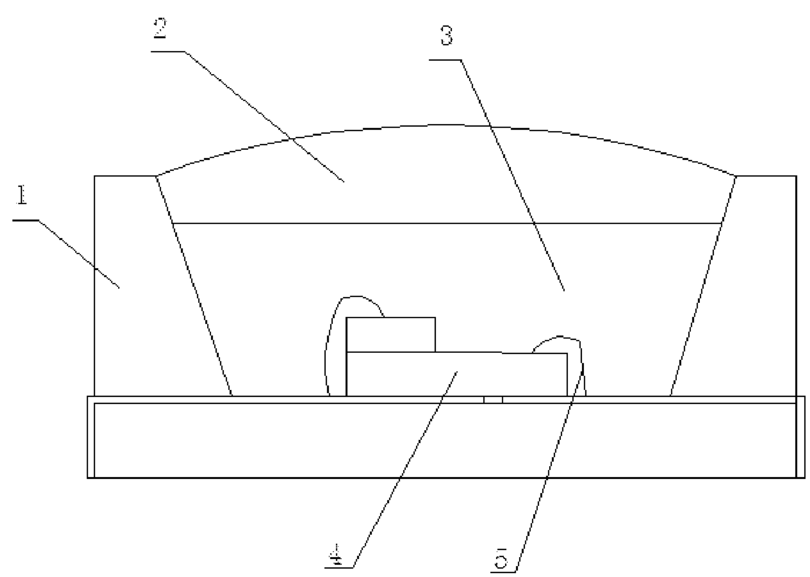

In order to more sufficiently illustrate the light converging effect of the LED lighting device, the LED lighting devices shown in FIGS. 1 and 4 may be compared with each other. FIG. 1 is a schematic diagram of a structure of a LED lighting device of the prior art, and shows an inclined sidewall of the frame, and the light emitting range of the LED lighting device is 60-120 degrees. FIG. 4 is a schematic diagram of a structure formed by applying the light condensing layer 2 in the embodiment of the disclosure on the basis of the LED lighting device of the prior art. The light emitting range of the LED lighting device shown in FIG. 4 may be narrowed to 75-105 degrees. In the case that total light emitting energy maintains unchanged, the smaller the light emitting range is, the higher the brightness is. Therefore, with the light condensing layer 2, the purpose of improving brightness may be effectively realized.

Figure 5:
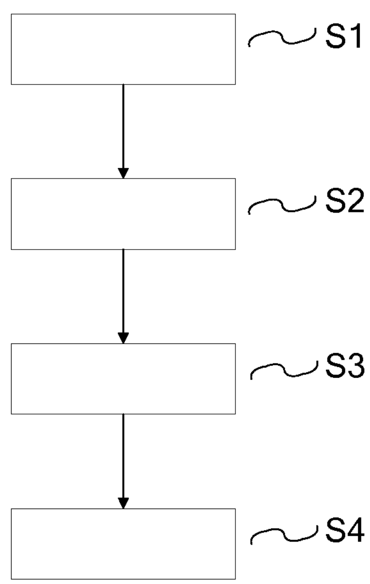
FIG. 5 is a flow chart of a packaging method of a LED lighting device according to an embodiment of the disclosure.

FIG. 5 is a flow chart of a packaging method of a LED lighting device according to an embodiment of the disclosure.

Referring to FIG. 5, a packaging method of a LED lighting device according to an embodiment of the disclosure comprises the steps of: fixing chips to a bottom of a frame (S1); connecting electrodes of the chips to the frame (S2); injecting molten-state mixed colloid of phosphor powder and packaging adhesive into the frame to form a light emitting layer (S3); and injecting molten-state packaging adhesive into the frame to form a light condensing layer (S4).

In step S1, the frame may be cup-shaped, and the chips may be bonded to the bottom of the frame by a die bond adhesive. The die bond adhesive may be epoxy resin or silica gel.

In step S2, the electrodes of the chips are connected to the frame by the connection wires. The connection wires function as electric connection in LED packaging. When current passes, the current flows into the chips via the connection wires to enable the chips to emit light.

In step S3, firstly, the mixed colloid of the phosphor powder and the packaging adhesive is heated to be in a molten state. Then, the molten-state mixed colloid of the phosphor powder and the packaging adhesive is injected into the frame. The liquid level of the mixed colloid is controlled to be lower than the upper port of the frame by controlling the injected amount of the mixed colloid, that is, the mixed colloid does not full fill the frame. The light emitting layer may be formed after the mixed colloid is solidified.

In step S4, the packaging adhesive heated to be in a molten state is injected into the frame formed with the light emitting layer. The molten-state packaging adhesive may be pressed by an inward-recessed mould to form the light condensing layer with a convex upper surface. The surface of the mould may be subjected to a polishing treatment, and thus, the packaging adhesive may not be bonded to the mould. The light condensing layer with the required shape may be formed after the packaging adhesive is solidified.

The curvature radius of the curved surface of the light condensing layer is controlled by controlling the inward-recessed shape of the mould. The curvature radius of the curved surface may be greater than or equal to ½ of the length of the LED lighting device, and less than or equal to 10 times of the length of the LED lighting device. When the curvature radius of the curved surface of the light condensing layer is in this range, the light can be converged obviously. In addition, the packaging adhesive may comprise epoxy resin or other hot-melt-state substance with high light transmittance.

According to an embodiment of the disclosure, the step (S3) of forming the light emitting layer may comprise: injecting the molten-state mixed colloid of the phosphor powder and the packaging adhesive into the frame, and forming a plane in the frame by virtue of the characteristics of a fluid substance, and thus the upper surface of the light emitting layer is a plane. On this basis, the step (S4) of forming the light condensing layer is then carried out, thus the lower surface of the light condensing layer is also a plane.

According to another embodiment of the disclosure, the step (S3) of forming the light emitting layer may comprise: pressing the molten-state mixed colloid of the phosphor powder and the packaging adhesive by an outward-bulged mould to form the light emitting layer with a concave upper surface. On this basis, the step (S4) of forming the light condensing layer is then carried out, thus the lower surface of the light condensing layer is a convexity.

In the packaging method according to the disclosure, the light emitting layer and the light condensing layer are formed from different substances by two injections, respectively. The method has simple process, low manufacturing cost and high practical value. The light emitting layer comprising phosphor powder is formed by the first injection; the light condensing layer with the shape of a convex lens is formed by the second injection, and the LED brightness is improved by converging light by the light condensing layer.

The embodiments of the disclosure are given for examples and description, and do not intend to limit the scope of the disclosure. Many modifications and variations are obvious to those skilled in the art. The embodiments are selected and described for better illustrating the principle and actual applications of the disclosure, and for enabling those skilled in the art to understand the disclosure so as to design various implementations suitable for specific applications and with various modifications.

The invention claimed is:

1. A LED lighting device, comprising a frame and at least one chip fixed in the frame, and further comprising a light emitting layer and a light condensing layer, wherein the light emitting layer wraps the chip, and the light condensing layer is arranged on the light emitting layer and configured for converging light passing through the light emitting layer, wherein the light condensing layer has a shape of a convex lens, an upper surface and a lower surface of the light condensing layer are convexities, and an upper surface of the light emitting layer is a concave corresponding to the lower surface of the light condensing layer, wherein the light condensing layer is formed by a packaging adhesive, and the light emitting layer is prepared by mixing phosphor powder with the packaging adhesive, and wherein the light condensing layer includes the packaging adhesive only.

2. The LED lighting device according to claim 1, wherein the convexity is a curved surface, and a curvature radius of the curved surface is greater than or equal to ½ of a length of the LED lighting device, and less than or equal to 10 times of the length of the LED lighting device.

3. The LED lighting device according to claim 1, wherein the at least one chip is fixed to a bottom of the frame by a die bond adhesive.

4. A packaging method of a LED lighting device, comprising steps of:

fixing chips to a bottom of a frame;

connecting electrodes of the chips to the frame;

injecting molten-state mixed colloid of phosphor powder and packaging adhesive into the frame to form a light emitting layer; and injecting molten-state packaging adhesive into the frame to form a light condensing layer;

wherein the step of injecting molten-state mixed colloid comprises:

pressing the molten-state mixed colloid of the phosphor powder and the packaging adhesive by an outward-bulged mold to form the light emitting layer with a concave upper surface, wherein the step of injecting molten state packaging adhesive comprises:

pressing the molten-state packaging adhesive by an inward-recessed mold to form the light condensing layer with a convex upper surface, and wherein the light condensing layer is formed by a packaging adhesive only, and the light emitting layer is prepared by mixing phosphor powder with the packaging adhesive.

* * * * *